United States Patent [19]
Wehnelt

[11] Patent Number: 4,894,751
[45] Date of Patent: Jan. 16, 1990

[54] PRINTED CIRCUIT BOARD FOR ELECTRONICS

[75] Inventor: Ulrich Wehnelt, Soecking, Fed. Rep. of Germany

[73] Assignee: Siemens Aktiengesellschaft, Berlin and Munich, Fed. Rep. of Germany

[21] Appl. No.: 197,602

[22] Filed: May 20, 1988

[30] Foreign Application Priority Data

Aug. 14, 1987 [DE] Fed. Rep. of Germany ..... 68711105

[51] Int. Cl.[4] .............................................. H05K 1/18
[52] U.S. Cl. .................................. 361/398; 228/180.1; 228/180.2; 361/404; 361/411
[58] Field of Search ............... 361/404, 411, 401, 398; 228/179, 180.1, 180.2

[56] References Cited

U.S. PATENT DOCUMENTS

| | | | |
|---|---|---|---|
| Re. 27,934 | 3/1974 | Merrin et al. | 361/404 X |
| 3,292,240 | 12/1966 | McNutt | 361/411 X |
| 3,727,296 | 4/1973 | Cranston | 228/180.1 |
| 3,827,918 | 8/1974 | Ameen et al. | 361/411 X |
| 3,829,601 | 8/1974 | Jeanotte et al. | 361/411 X |
| 3,832,769 | 9/1974 | Olyphant et al. | 361/398 X |
| 4,074,342 | 2/1978 | Hohn et al. | 361/411 |
| 4,079,284 | 3/1978 | Fanshawe | 361/401 X |
| 4,151,579 | 4/1979 | Stark | 361/404 X |
| 4,413,308 | 11/1983 | Brown | 361/398 |
| 4,426,689 | 1/1984 | Henle et al. | 361/398 X |
| 4,673,772 | 6/1987 | Satoh et al. | 174/52.4 |
| 4,783,772 | 11/1988 | Osaki et al. | 361/411 |

FOREIGN PATENT DOCUMENTS

| | | | |
|---|---|---|---|
| 2415120 | 2/1975 | Fed. Rep. of Germany | 361/411 |
| 59-215759 | 12/1984 | Japan | 361/404 |
| 2036624 | 7/1980 | United Kingdom | 228/179 |

Primary Examiner—R. R. Kucia
Attorney, Agent, or Firm—Hill, Van Santen, Steadman & Simpson

[57] ABSTRACT

An easily automated and heat-stable semiconductor contacting system for linear and planar SMD components, particularly LED arrangements. SMD components are applied to a carrier film coated with interconnects. The interconnects are entirely or partly formed of solderable material for simpler contacting through melting.

21 Claims, 4 Drawing Sheets

PRINTED CIRCUIT BOARD FOR ELECTRONICS

BACKGROUND OF THE INVENTION

The invention is directed to a printed circuit board for electronics, and particularly a printed circuit board formed of a flexible carrier material.

It is known to solder components onto a surface that carries the interconnects directly to the interconnects from above. This is referred to as the SMD technique (Surface Mounted Devices).

SUMMARY OF THE INVENTION

An object of the invention is to specify an easily automatable and heat-stable semiconductor contact both for linear as well as for planar semiconductor arrangements.

This is inventively achieved in an arrangement of the type initially cited wherein the interconnects are composed of a solderable metal or of a solderable alloy at least at the surface at which they can be connected to the components. The components, and particularly semiconductor chips, are then connected to the conductors by melting the solderable material.

DESCRIPTION OF THE PREFERRED EMBODIMENTS

Figure 1:
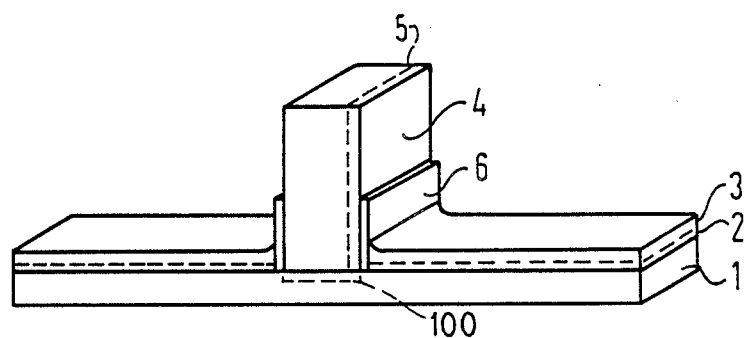
FIG. 1 shows a perspective view of a contacted light-emitting diode in film technique.

A thin (approximately 1 $\mu$m) copper layer 2 is applied (coated in currentless fashion or vapor-deposited) onto a flexible plastic carrier film 1 (for example polyethylene terephthalate, polymide, epoxy resin/fiberglass fabric). This copper layer 2 is subsequently galvanically reinforced to about 5 $\mu$m. This reinforcement is necessary so that the interconnect structure can be etched and, moreover, it increases the heat elimination out of the contact zone. After the etching of the desired interconnects, an approximately 5 to 20 $\mu$m thick tin layer 3 or some other solderable metal or a solderable alloy is likewise electro-deposited. The contacting of the component 4, which is a semiconductor chip and particularly a LED (light emitting diode) here, is performed with a solder-die after the crystal has been positioned at a metal-free region. One respective metal contact 6 for the semiconductor is arranged on interconnect 3. The insertion depth, the temperature of the crystal, and the pressure on the crystal can be set in a defined fashion with this solder die. The temperature must be selected such that the metal of the interconnect melts and the chip sinks into the carrier film for mechanical anchoring as shown at 100 in FIG. 1. The pn-junction of the semiconductor is referenced 5.

The geometry of the interconnects, and particularly their spacing is dependent on the dimensions of the semiconductors to be contacted, and is dependent on the desired current-loadability of the component 4.

However, it is also possible to etch and tin plate the interconnects on a Cu film laminated with a plastic film in order to contact the semiconductor chips. A further increase in the heat elimination can thus be achieved. However, the tolerances, and particularly the spacing of the interconnects and the thickness of the chips, must be extremely precisely observed.

The desired interconnect geometry for the contacting can also be etched in a solderable metal film (for example, tin film) that is laminated on a carrier film. No further work cycles are then required.

Constructing the interconnects of easily meltable layers is especially advantageous because additional techniques to prevent short-circuiting of the pn-junction of the semiconductor are not required. The melting of the metals (Sn or SnPb alloy) and of the plastic in the environment of the crystal also removes a Cu layer from the jeopardized zone in that these substances yield to the pressure of the crystal. A significant advantage in this type of contacting is that, in contrast to the nail-head bonding, only one work step is required in order to contact the p-side and the n-side. Moreover, this method offers the possibility of simultaneously contacting a plurality of crystals, or of contacting a semiconductor circuit comprising a plurality of terminals, in one work cycle.

It has proven especially advantageous for the alloy formation in the contact zone to use a semiconductor crystal that carries an additional gold layer 6 over the alloyed-in ohmic contacts.

Figure 2:
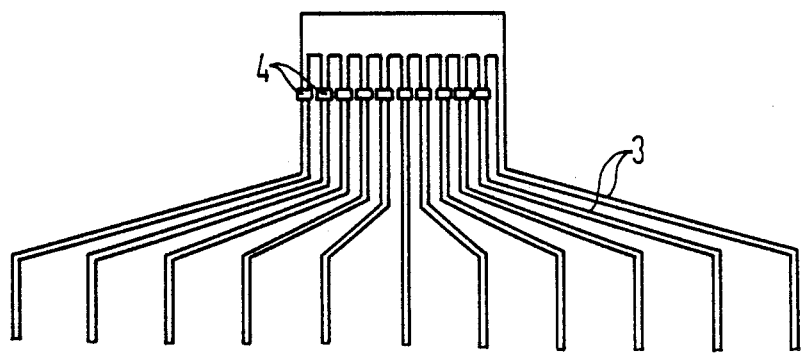
FIG. 2 shows a row of 10 diodes in a pattern having a grid dimension of 0.5 mm.
Figure 3:
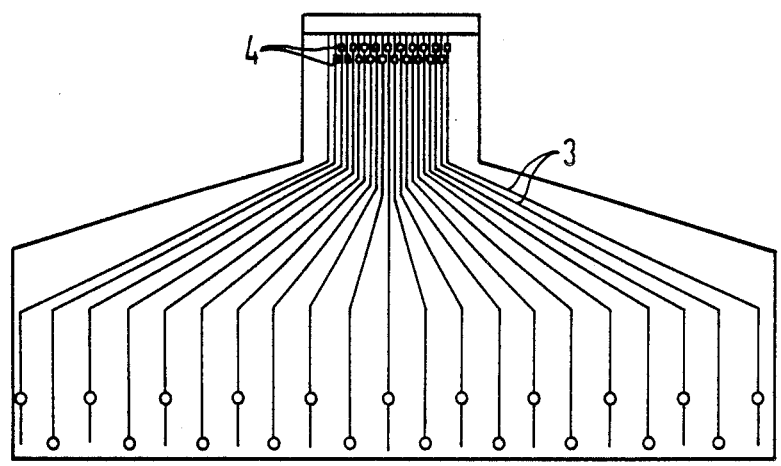
FIG. 3 shows an example of an offset arrangement of 20 light emitting diodes in a row.
Figure 4:
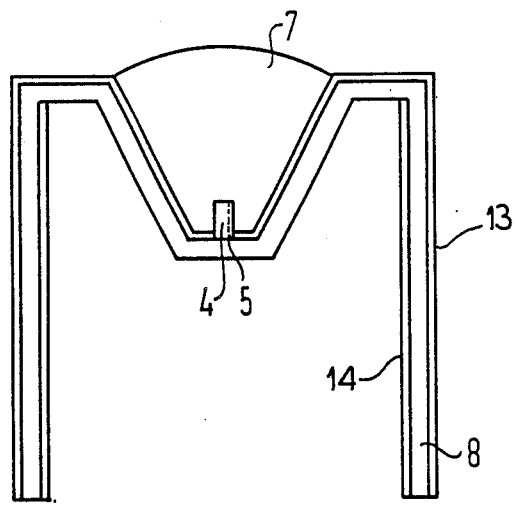
FIG. 4 shows a cross-section through a pluggable arrangement of the invention.

The recited contacting is very suitable for a line arrangement, particularly given a slight spacing between the individual components, since a significantly tighter packing of the semiconductors is possible than in a traditional technique. As an example, a row of 10 diodes with a grid dimension pattern of 0.5 mm is shown in FIG. 2. An arrangement comprising 20 offset diodes with a grid dimension of 211 $\mu$m is recited in FIG. 3. In case a pluggable component—both a discrete element as well as an arbitrary multiple row—is to be manufactured, it is possible to bring the plastic carrier into a shape on the basis of suitable methods (for example deep drawing or hot-pressing) to punch feet and to then solder the semiconductor in, as shown in FIG. 4. For better solderability of the feet 8, a film laminated with copper on both sides can be employed at these locations (FIG. 4). The arrangement shown in this FIG. 4 has an M shape such that the semiconductor component 4 is centrally soldered to the outer interconnects and is embedded in a casting compound 7. The inside interconnects are only provided for facilitating the solderability to the printed circuit board.

Figure 5:
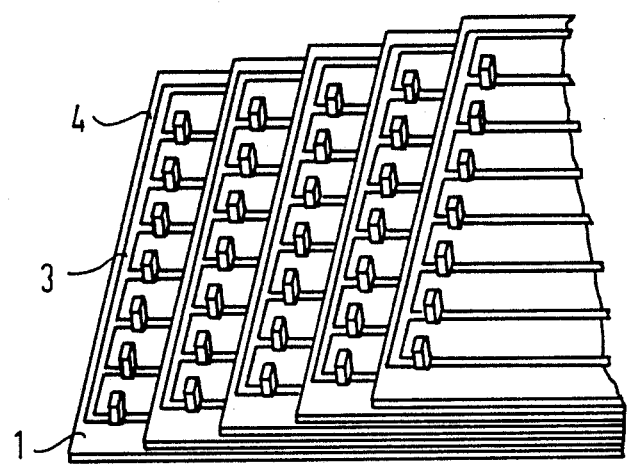
FIG. 5 shows an alphanumerical display in stacked technology.

This technique offers particular advantages, and specifically for a light-emitting diode arrangement in a matrix form. This method, referred to as the stacked technique, for example results in an alpha-numeric display having 5×7 light-emitting diodes in a grid dimension of 1 mm, as shown in FIG. 5. Five carrier films each having 7 light-emitting diodes are thus arranged on top of one another and are secured such that a grid dimension of 1 mm also arises between the lines.

Figure 6:
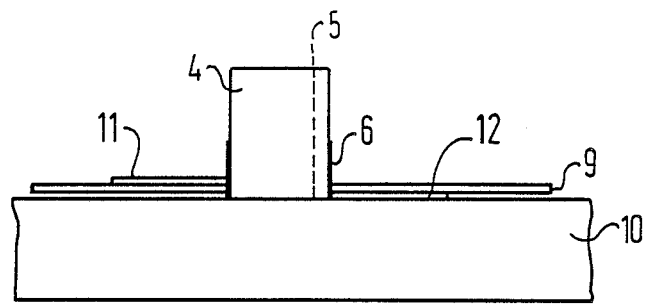
FIG. 6 shows a cross-section through an element of a two-plane contacting.
Figure 7:
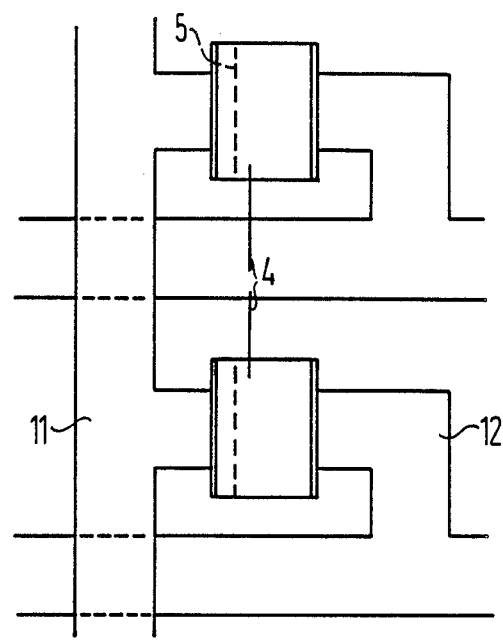
FIG. 7 shows a plan view of two elements in a 2-plane contacting.

FIG. 6 shows a further possibility for manufacturing a matrix, whereby the leads to the light-emitting diodes are arranged on two sides of a thin plastic film 9. It is thus possible to solder a planar interconnect 11 to the gold layers 6 of the semiconductor at the inside in the contact zone, and to solder a lower interconnect 12 at the other side. For reinforcing, the carrier film comprising the two interconnect levels is glued onto a thick, insulating support 10. This technique, shown in FIG. 6 as a 2-plane contacting represents an interlayer connection. Here, too, the two metal coatings 6 of the semiconductor 4 are connected in one work cycle to the two leads 11, 12 on the two sides of the thermoplastic carrier film 9.

Although various minor changes and modifications might be proposed by those skilled in the art, it will be understood that I wish to include within the claims of the patent warranted hereon all such changes and modifications as reasonably come within my contribution to the art.

I claim as my invention:

1. A printed circuit board system, comprising:
   a meltable carrier having electronic components mounted thereon, the components each having a bottom portion and a conductive coating at connecting zones at sides of the components adjacent the bottom portion;
   the carrier having interconnects thereon formed of a solderable metal, said interconnects being positioned at least at a surface of said carrier at which said interconnects connect to the electronic components; and
   the electronic components being partially sunk at the bottom portion into a melted portion of the carrier for mechanical stability and being connected to the interconnects at said surface by said solderable metal, a flowed and previously melted portion of said solderable metal being in contact with the conductive coating of the components.

2. A printed circuit board system according to claim 1 wherein said solderable metal comprises an alloy.

3. A printed circuit board system according to claim 1 wherein the electronic components comprise semiconductors with a linear layout provided with a solderable metal coating thereon at said connecting zones thereon.

4. A printed circuit board system according to claim 1 wherein the electronic components comprise planar semiconductors with a planar layout provided with a solderable metal coating at said connecting zones thereof, said sides of the planar semiconductor extending in a substantially perpendicular direction relative to said surface of said carrier.

5. A printed circuit board system according to claim 1 wherein the electronic components are semiconductors provided with a gold layer metal coating at connecting zones thereon.

6. A printed circuit board system according to claim 1 wherein said electronic components comprise light-emitting diodes (LED).

7. A printed circuit board system according to claim 1 wherein a plurality of printed circuit boards are provided such that in combination, the electronic components are arranged in row and column fashion.

8. A printed circuit board system according to claim 7 wherein the printed circuit boards are arranged in multi-layer fashion on top of one another and offset with respect to one another.

9. A printed circuit board system according to claim 1 wherein the electronic components are fused into the solderable material and also into a plastic supporting portion of the carrier.

10. A printed circuit board system according to claim 1 wherein the carrier has interconnects at both the underside and upperside, and wherein the carrier is attached to a carrier support.

11. A printed circuit board system according to claim 1 wherein the carrier comprises a flexible carrier material.

12. A printed circuit board system according to claim 1 wherein the components are semiconductor chips.

13. A printed circuit board system, comprising:
    a flexible meltable plastic carrier;
    an interconnect on at least one surface of the carrier formed of a solderable metal;
    a semiconductor component secured to the carrier at a bottom portion thereof and having a contact on a side wall of the component which is adjacent the bottom portion and which extends in an upward direction relative to the carrier surface, said contact being directly connected to a melted portion of the solderable material which is in a flowed connection with the component contact; and
    said bottom portion having sunk into a melted portion of the carrier.

14. A method for constructing a printed circuit board, comprising the steps of:
    providing an electronic component having a mounting surface and a contact surface;
    providing a meltable carrier;
    applying a metal interconnect layer formed of a solderable metal onto a surface of the carrier;
    positioning the electronic component adjacent the metal interconnect layer and onto the surface of the carrier; and
    applying heat to the electronic component such that the electronic component sinks at its mounting surface into the carrier as the carrier partially melts and the solderable metal melts into a flowing contact with the contact surface of the electronic component, the electronic component being designed to withstand without damage the heat applied thereto which results in the sinking of said component into the carrier and the melting of the solderable metal to cause said flowing contact.

15. A method according to claim 14 wherein said solderable metal comprises an alloy.

16. A method according to claim 15 including the steps of providing said solderable metal interconnect as a copper layer which is applied onto the carrier and is covered with a tin layer.

17. A method according to claim 16 wherein said copper layer is galvanically reinforced prior to application of the tin layer.

18. A method according to claim 14 wherein said electronic component has a metal layer thereon and the interconnect when melted flows in solidering contact to the metal layer.

19. A method according to claim 14 wherein said component is pressed down onto the carrier by a solder die.

20. A method according to claim 14 wherein said electronic component is fused into the solderable metal interconnect as well as into a plastic supporting portion of the carrier by means of a solder die.

21. A method for constructing a printed circuit board, comprising the steps of:

providing an electronic component having a bottom mounting surface and a side contact surface adjacent the mounting surface;
providing a meltable carrier;
applying a metal interconnect layer thereon formed of a solderable metal;
placing the electronic component onto the carrier adjacent the metal interconnect layer such that said side contact surface of the electronic component extends upwardly from the carrier; and
applying heat such that the bottom mounting surface of the electronic component partially melts into the carrier and the solderable metal interconnect layer melts into flowing contact with the contact surface on the side wall of the electronic component.

* * * * *